United States Patent [19]
Yamazaki et al.

[11] Patent Number: 4,847,669
[45] Date of Patent: Jul. 11, 1989

[54] TANDEM PHOTOELECTRIC CONVERSION DEVICE

[75] Inventors: Shunpei Yamazaki, Tokyo; Masayoshi Abe, Tama; Susumu Nagayama, Tokyo; Kunio Suzuki, Atsugi; Takeshi Fukada, Ebina; Mikio Kinka, Atsugi; Katsuhiko Shibata, Atsugi; Masato Susukida, Atsugi, all of Japan

[73] Assignee: Semiconductor Energy Laboratory Co., Ltd., Kanagawa, Japan

[21] Appl. No.: 942,702

[22] Filed: Dec. 17, 1986

[30] Foreign Application Priority Data

Dec. 17, 1985 [JP] Japan .................. 60-284781

[51] Int. Cl.⁴ .............. H01L 27/14; H01L 31/00
[52] U.S. Cl. ........................................ 357/30; 357/2
[58] Field of Search .............. 357/30 F, 30 K, 30 H, 357/30 J, 2; 136/249 T, 249 J

[56] References Cited
FOREIGN PATENT DOCUMENTS 0240167 11/1985 Japan ................ 136/249 TJ

OTHER PUBLICATIONS

M. Green; "Crystalline and Polycrystalline Silkon Tandem Junction Solar Cells: Theoretical Advantages"; Solar Cells, 18(1986), 31–40 (Jul.).

Primary Examiner—William L. Sikes
Assistant Examiner—B. R. Holloway
Attorney, Agent, or Firm—Gerald J. Ferguson, Jr.

[57] ABSTRACT

An improved tandem photoelectric conversion device is shown. The device comprises at least two photoelectric conversion semiconductor assemblies. The assembly located behind the other has higher crystallinity then the other, so that light with a long wavelength passing through the front assembly be converted into electricity at the back assembly. In the device, an intrinsic semiconductor layer is formed by an ECR CVD system.

6 Claims, 2 Drawing Sheets

FIG. 1 (A) PRIOR ART
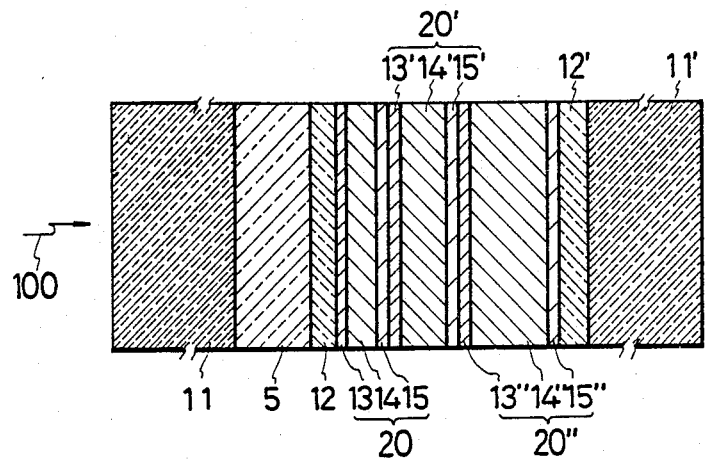
FIG. 1 (B) PRIOR ART
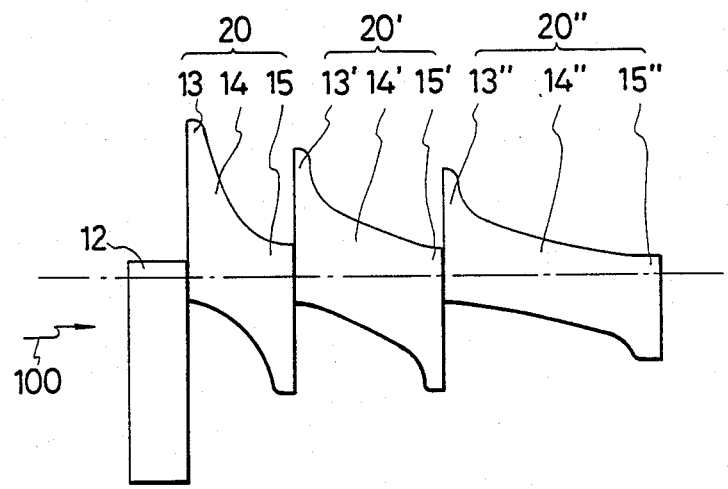

TANDEM PHOTOELECTRIC CONVERSION DEVICE

BACKGROUND OF THE INVENTION

The present invention relates to an improved photoelectric conversion device.

A typical device capable of converting light energy into electricity throughout a wide range of wave length is a solar cell incorporating amorphous semiconductor layer. An example of such a solar cell is illustrated in FIGS. 1(A) and 1(B). The solar cell is designed tandem and comprises three cell units 20, 20' and 20" arranged in series between a transparent substrate 11' and a back substrate 11'. The cell units 20, 20' and 20" are composed respectively of p-type semiconductors 13, 13' and 13", i-type semiconductors 14, 14' and 14" and n-type semiconductor 15, 15' and 15". Each layers are fabricated by glow discharge plasma CVD on the substrate 11' and the transparent substrate 11 is covered thereon through a transparent resin layer 5.

Whereas such a solar cell of this prior art is suitable in mass production since each layer can be formed on the preceding one in sequence, a defect(pinhole) on one cell unit reduces the whole cell to impotence and the yield of the production of this cell is remarkably decreased.

Further, in the tandem cell the cell units 20, 20' and 20" have to be arranged so that the closer a cell unit is located to the incident side, the wider the energy gap of a cell unit is and the thinner the intrinsic semiconductor layer of the cell unit is, in order to carry out conversion of light having short wave length without undesirable thermally absorption of light in a preceding cell unit. The intrinsic semiconductor layer 14, 14' and 14" are made of $Si_xGe_{1-x}(0<x<1)$. To comply with the above requirement on band gap, x is chosen 1 for the layer 14, 0.8 for the layer 14' and 0.6 for the layer 14". Namely the Ge density of a thicker layer must be higher than a thinner layer. It reduces the economical advantage of an amorphous silicon semiconductor solar cell.

SUMMARY OF THE INVENTION

It is therefore an object of the invention to provide a photoelectric conversion device with a high cost performance.

In order to accomplish the above objective, according to the invention, the energy gap is controlled by varying the crystallinity of an intrinsic layer.

BRIEF DESCRIPTION OF THE DRAWINGS

FIG. 1(A) is a cross section view showing a prior art photoelectric conversion device;

FIG. 1(B) is a schematic diagram showing the configuration of the energy gap of a prior art photoelectric device;

DETAILED DESCRIPTION OF THE PREFERRED EMBODIMENT

Figure 2:
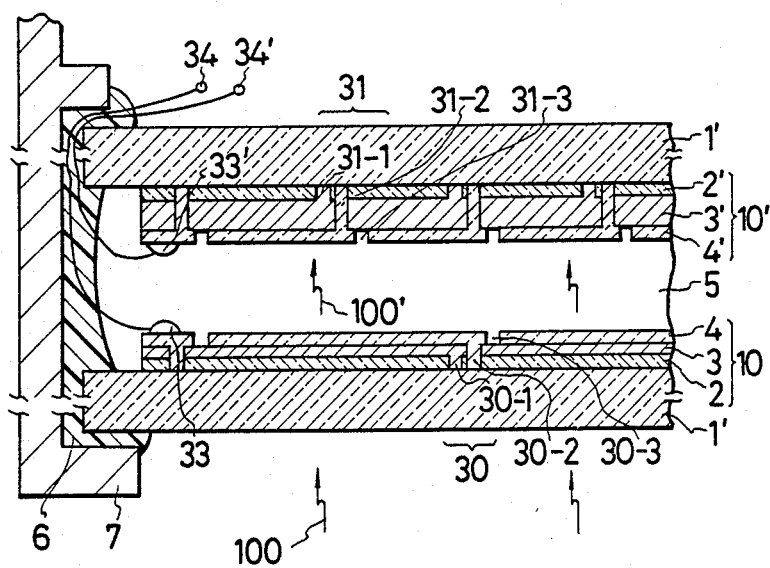
FIG. 2 is a cross section view showing a photoelectric conversion device according to the invention.

Referring to FIG. 2, a photoelectric device according to the invention is illustrated. The device is comprised of a combination of first and second cell assemblies of similar structure. The two assemblies are mated in parallel and opposed relation to each other with transparent medium layer such as ethylene-vinyl-alcohol layer inbetween. Light is incident on the outside of a transparent substrate 12. On the inner side of the substrate 1 are a plurality of cell units 10, 11 connected in series. Each cell unit comprises a transparent electrode 2, a non-single-crystal semiconductor layer with a pin junction therein and an transparent electrode 4. The non-single-crystalline semiconductor layer is fabricated by a glow discharge plasma enhanced CVD system so as to be amorphous semiconductor. The connection structure for establishing a serial connection of adjacent cell units comprises a perpendicularly extending portion 30-2 of the electrode 4 making contact with the electrode 2 of the adjacent cell, a groove 30-3 isolating the electrodes 4 from one the other, and an isolating portion 30-1 of the semiconductor layer 3 extending between the electrode 4 in contact with the electrode 2 of the adjacent cell and the electrode 2 opposite the electrode 4.

The second assembly comprised of a substrate 1' and a plurality of semiconductor cell units is different from the first assembly only in that the thickness of the intrinsic semiconductor layer is larger than that of the first assembly and the energy gap of the intrinsic semiconductor is narrower than that of the first assembly. With this structure, the short wave length component of incident light is mainly absorbed by the first assembly and then the remaining long wave length component of the incident light is absorbed by the second assembly.

The intrinsic semiconductor layer is polycrystalline semiconductor formed by an ECR PCVD, an electron cyclotron resonance plasma enhanced CVD (ECR PCVD), capable of fabricating a relatively thick semiconductor layer (1 to 10 micron meter in thickness) with a narrower energy gap than that of amorphous semiconductor even if the same elements are used for fabricating semiconductor. According to an ECR PCVD, a fabricated semiconductor layer has crystallinity higher than a semiconductor layer fabricated by a glow discharge PCVD. The energy gaps of silicon semiconductor fabricated by an ECR PCVD is about 1.5 to 1.6 eV while the energy gaps of monocrystalline and amorphous silicon semiconductors are about 1.2 to 1.3 eV and 1.7 to 1.8 eV respectively. The differences between the several types of silicon semiconductor are attributed mainly to the differences between the crystallinities of the semiconductors. Both the semiconductor layers of the first assembly and second assembly are not doped with fluorine and gerumanium.

Figure 3:
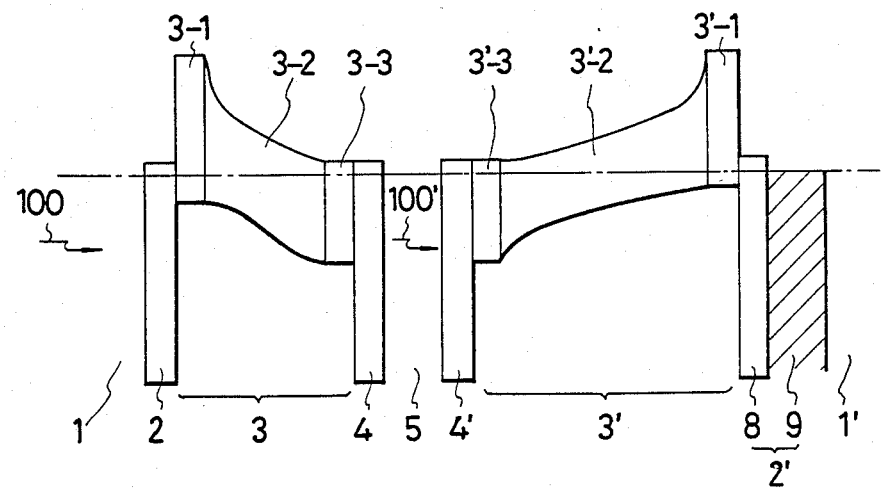
FIG. 3 is a schematic diagram showing the configuration of the energy gap of a photoelectric conversion device.

FIG. 3 is a schematic diagram showing the energy gap configuration of a semiconductor device according to the invention. Like portions are designated with like numerals between FIGS. 2 and 3 and in FIG. 3 the actual dimensions indicate no important meaning. In this structure, since the first assembly and the second assembly are constructed in the same manner as seen from the substrates, both assemblies can be formed by the same processing system. The first non-single-crystalline semiconductor 3 comprises of a first p-type semiconductor layer 3-1, a first intrinsic non-single-crystalline semiconductor layer 3-2 and a first n-type semiconductor layer 3—3, each semiconductor being fabricated by a glow discharge CVD at 150° to 250° C. The second non-single-crystalline semiconductor 3' comprises of a second p-type semiconductor layer 3'-1, a second intrinsic non-single-crystalline semiconductor layer 3'-2 and a second n-type semiconductor layer 3'-3. The second intrinsic semiconductor layer 3'-2, however, is fabricated by a ECR PCVD system at a substrate temperature of 350° to 900° C., more preferably, at 400° to 700° C. while the p-type and n-type semiconductors layers 3'-1 and 3'-3 are fabricated by a glow discharge CVD, each layers having 1 to 10 micron meter in thickness. The ECR PCVD is advantageous due to its high deposition speed and small residual stress. Out of the product of each assembly, inferior articles are removed prior to coupling the two with EVA inbetween. Devices thus completed have their large strength with joined two glass substrates. Example :

In FIG. 2, The first cell assembly was made as explained in the followings. A conductive transparent layer 2 made of tin oxide was formed on a glass substrate by sputtering or CVD, and separated into a plurality of lands by the grooves 30-1 by means of a first laser cutting. On the layer 2 and the grooves 30-1, a p-type non-single-crystalline semiconductor layer of $Si_xC_{1-x}$ with 100 to 200 Å in thickness, an intrinsic non-single-crystalline semiconductor layer of Si with 100 to 400 Å, for example 250 Å in thickness, an n-type non-single-crystalline semiconductor layer siliconcrystallites with 100 to 300 Å in thickness. Thereafter, second grooves 30-2 were cut by a second laser cutting adjacent to the first grooves 30-1.

After cutting the second grooves 30-2, a second conductive transparent layer 4 made of zinc oxide was deposited by sputtering, and separated into a plurality of lands by grooves 30-3 by means of a third laser cutting. Thus the formation of a first assembly was completed.

Then, a second assembly was formed in the following manner. On a substrate 1' a conductive layer of molybdenum was formed by sputtering with 0.1 micron meter in thickness. Further on the molybdenum layer a tin oxide layer was formed by sputtering with 0.3 micron meter. The multi-layered electrode 2' were separated into a plurality of lands by grooves 31-1 by means of fourth laser cutting.

Over the electrode 2' were formed in sequence a p-type non-single-crystalline semiconductor layer of $Si_xC_{1-x}$ ($0 < x < 1$) by means of glow discharge plasma CVD with 100 to 200 Å in thickness, an intrinsic non-single-crystalline semiconductor layer of Si by means of an ECR CVD system at 300° to 900° C., for example at 450° C. with 1 to 10 micron meter in thickness, an n-type non-single-crystalline semiconductor layer microcrystalline silicon at 450° C. with 100 to 300 Å in thickness. The semiconductor layers were let undergo hydrogen annealing in an atmosphere of active hydrogen at 300° C. so that the recombination density was reduced by a factor of ten.

On the annealed semiconductor layers grooves 31-2 were cut by a fifth laser cutting adjacent to the first grooves 30-1. After cutting the second grooves 31-2, a second conductive transparent layer 4' made of zinc oxide was deposited by sputtering, and separated into a plurality of lands by grooves 31-3 by means of a sixth laser cutting. Thus the formation of a second assembly was completed with interconnection portions 31 through which a plurality of cells were connected in series.

The numerals 33 and 33' designate electricity taking out portions connected with the output lines 34 and 34'. Then the two asemblies were coupled with EVA inbetween, disposed between laminate sheets, and pressed by extracting air between the sheets at 150° C. so that the two assemblies were tightly mated through the melted EVA layer without remaining air. Finally the periphery of the device was secured by an aluminium frame 7 with butyl rubber 6.

The energy gap configuration of the device thus formed is shown in FIG. 3 already explained supra. The photoelectric conversion characteristics of the device are as follow:

open-circuit voltage (V): 0.87, 0.53, 1.35
short-circuit current (mA/cm2): 14.6, 24.3, 14.5
fill factor: 0.76, 0.78, 0.64
conversion efficiency (%): 9.65, 10.05, 12.56

In the above, the left figures are of the first assembly alone, the center figures are of the second assembly and the right figures are of the combination of the first and second assemblies connected in series.

Next, a first assembly and a second assembly were formed on substrates 10 cm wide and 10 cm long with eight cells and sixteen cells respectively, the cell being connected in series on each assembly, in which eight cells of the second assembly were located in coincidence with the eight cells of the second assembly. The following data were obtained with the device thus formed.

open-circuit voltage (V): 6.8, 8.01, 14.4
short-circuit current (mA/cm2): 12.2, 13.3, 13.0
fill factor: 0.74, 0.69, 0.66

In the above, the left figures are of the first assembly alone, the center figures are of the second assembly and the right figures are of the combination of the first and second assemblies connected in series.

Besides the high performance of photoelectric conversion action, degraduation of the device, so-called Steablar-Wronsky Effect was rarely observed because the first intrinsic semiconductor layer was thin, 0,25 micron meter, on the light incident side.

While the present invention has been described with reference to a specific preferred embodiment thereof, many variation and modification will now occur to those skilled in the art. It is our intent, therefore to be limited solely by the scope of the appending claims.

What is claimed is:

1. A photoelectric conversion device comprising:
   a pair of substrates, at least one of which is transparent;
   a structure for supporting said pair of substrates in parallel;
   a first photoelectric conversion semiconductor device formed on one of the opposed inner surfaces of said pair of substrates;
   a second photoelectric conversion semiconductor device formed on the other of the opposed inner surfaces of said pair of substrates such that there is a gap between the first and second photoelectric conversion semiconductor devices; and
   an insulating material filling the gap between said first and second photoelectric conversion semiconductor devices for preventing said semiconductor devices from contacting air.

2. The device of claim 1 wherein said first and second photoelectric conversion semiconductor devices are layered semiconductors incorporating pin junction therein.

3. The device of claim 2 wherein the substrate carrying said first photoelectric conversion semiconductor device is transparent so that said first semiconductor device receives incident light to be converted prior to the reception of said light by said second semiconductor device, the energy gap of the intrinsic semiconductor of said first semiconductor device being wider than that of said second semiconductor device.

4. The device of claim 3 wherein said second semiconductor device is thicker in the direction of the incident light than said first semiconductor device.

5. The device of claim 3 wherein each of said first and second semiconductor devices is formed of series-connected photoelectric conversion elements respectively and the area of each element of the first semiconductor device is larger than that of each element of the second semiconductor device where each area of an element is transverse to the direction of the incident light.

6. The device of claim 1 wherein the crystallinities of said first and second semiconductor devices are different so that the energy output of said first and second semiconductor devices is also different.

* * * * *